United States Patent
Muri et al.

(10) Patent No.: US 11,328,955 B2
(45) Date of Patent: May 10, 2022

(54) SEMICONDUCTOR CHIP INCLUDING BACK-SIDE CONDUCTIVE LAYER

(71) Applicant: Infineon Technologies AG, Neubiberg (DE)

(72) Inventors: Ingo Muri, Villach (AT); Bernhard Goller, Villach (AT)

(73) Assignee: Infineon Technologies AG, Neubiberg (DE)

( * ) Notice: Subject to any disclaimer, the term of this patent is extended or adjusted under 35 U.S.C. 154(b) by 10 days.

(21) Appl. No.: 16/938,206

(22) Filed: Jul. 24, 2020

(65) Prior Publication Data

US 2020/0365457 A1    Nov. 19, 2020

Related U.S. Application Data

(62) Division of application No. 16/144,169, filed on Sep. 27, 2018, now Pat. No. 10,784,161.

(30) Foreign Application Priority Data

Sep. 28, 2017    (DE) .......................... 102017122650.8

(51) Int. Cl.
*H01L 21/768* (2006.01)
*H01L 21/302* (2006.01)
*H01L 21/321* (2006.01)
*H01L 21/78* (2006.01)
*H01L 23/528* (2006.01)

(52) U.S. Cl.
CPC ...... *H01L 21/76892* (2013.01); *H01L 21/302* (2013.01); *H01L 21/32115* (2013.01); *H01L 21/76898* (2013.01); *H01L 21/78* (2013.01); *H01L 23/528* (2013.01)

(58) Field of Classification Search
CPC ......... H01L 21/76892; H01L 21/76898; H01L 21/302; H01L 21/32115; H01L 21/78; H01L 21/782; H01L 23/528; H01L 2221/68327; H01L 2221/6834; H01L 23/28; H01L 21/56; H01L 2924/06
See application file for complete search history.

(56) References Cited

U.S. PATENT DOCUMENTS

| 2004/0113283 | A1 | 6/2004 | Farnworth et al. |
| 2010/0136783 | A1* | 6/2010 | Lee ................ H01L 21/76898 438/667 |
| 2013/0037935 | A1 | 2/2013 | Xue et al. |
| 2014/0134802 | A1 | 5/2014 | Lin et al. |
| 2014/0361426 | A1 | 12/2014 | Moon et al. |

* cited by examiner

*Primary Examiner* — Thanh Y. Tran
(74) *Attorney, Agent, or Firm* — Murphy, Bilak & Homiller, PLLC

(57) ABSTRACT

A substrate wafer arrangement includes a substrate layer having a first main side and a second main side opposite the first main side, the first main side being a front-side and the second main side being a back-side, the substrate layer further having a plurality of semiconductor chips. A polymer structure arranged between the plurality of semiconductor chips extends at least from the front-side of the substrate layer to the back-side of the substrate layer and protrudes from a back-side surface of the substrate layer. The polymer structure separates a plurality of insular islands of conductive material, each insular island corresponding to a respective semiconductor chip of the plurality of semiconductor chips. Semiconductor devices produced from the substrate wafer arrangement are also described.

22 Claims, 6 Drawing Sheets

SEMICONDUCTOR CHIP INCLUDING BACK-SIDE CONDUCTIVE LAYER

TECHNICAL FIELD

Various embodiments relate generally to semiconductor devices formed with a self-aligned back-side conductive layer.

BACKGROUND

Semiconductor chips formed on a substrate wafer may be separated using a dicing before grinding (DBG) process. A substrate wafer first undergoes a partial dicing process on a front-side of the substrate wafer to form islands of chip dies. Then the kerfs are filled with epoxy and the front-side of the substrate wafer is bonded to a carrier. Once mounted, the back-side of the substrate wafer is thinned, for example, by grinding, to a target thickness to complete the die separation. After the thinning process, a metal layer is applied to the back-side of the substrate wafer via a metallization process. The metal layer is structured via lithography on the back-side of the substrate wafer and the chip dies are separated using a solvent to dissolve the epoxy and a wet chemical metal etching process to remove the portion of the back-side metal layer that spans between the islands of chip dies. This metallization process involves multiple costly lithographic processes to align the back-side and front-side conductive layers of each semiconductor.

SUMMARY

In various embodiments, a semiconductor device and a method for manufacturing thereof is provided. The semiconductor device including: a substrate layer having a first main side and a second main side opposite the first main side, the first main side is a front-side and the second main side is a back-side; more electrical components formed front-side of the substrate layer; a back-side conductive layer disposed on the back-side of the substrate layer; and a polymer structure that extends vertically at least from the front-side of the substrate layer to the back-side of the back-side conductive layer and surrounds the edges of the substrate layer and the edges of the back-side conductive layer.

The method for manufacturing the semiconductor device including: partially dicing a substrate wafer arrangement having a front-side and a back-side that is opposite the front-side, the substrate wafer arrangement further including a plurality of semiconductor chips, wherein the partial dicing forms trenches having depth around the plurality of semiconductor chips on the front-side of the substrate wafer arrangement, the depth being greater than a target thickness of a semiconductor chip; filling the trenches with a polymer material so as to form a polymer structure; first thinning the back-side of the substrate wafer arrangement so as to expose portions of the polymer structure; forming a conductive layer on the back-side of the substrate wafer arrangement so that the exposed portions of the polymer structure are covered; second thinning the back-side of the substrate wafer arrangement so as to form insular islands of conductive material from the conductive layer, the insular islands separated from each other by the polymer structure, each insular island corresponding to a respective one of the plurality of semiconductor chips; and dicing the substrate wafer along the polymer structure to form individual semiconductor chips.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
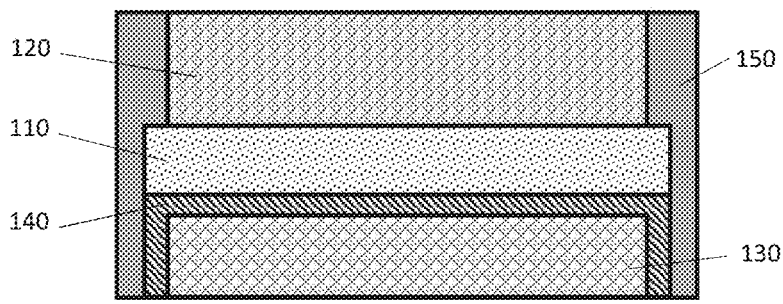
FIGS. 1A-1C are cross-sectional views of semiconductor devices having a self-aligned back-side conductive layer and a chip-edge encapsulation structure according to various embodiments.

Various embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order arrive at further embodiments according to the invention.

Identical elements are provided with the same or similar reference signs in the figures. A repeated description of these elements has been dispensed with in order to avoid repetition.

In the following detailed description, reference is made to the accompanying drawings, which form a part thereof, and in which is shown by way of illustration specific embodiments in which the invention may be practiced. In this regard, directional terminology, such as "top", "bottom", "front", "back", "above", "below", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical, electro-optical or electro-mechanical circuits and/or passives. The semiconductor chips may, for example, be configured as power semiconductor chips. Furthermore, the semiconductor chips may include integrated circuits, control circuits, microprocessors, or micro-electromechanical components. Furthermore, the devices described below may include logic integrated circuits to control the integrated circuits of other semiconductor chips, for example the integrated circuits of power semiconductor chips.

Semiconductor devices containing such semiconductor chips are described below. In various embodiments, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its front (or top) side and back (or bottom) side.

The semiconductor devices may include power semiconductor chips. Power semiconductor chips may have a vertical structure. The vertical power semiconductor chips may, for example, be configured as power MOSFETs (Metal Oxide Semiconductor Field Effect Transistors), IGBTs (insulated Gate Bipolar Transistors), JFETs (Junction Gate Field Effect Transistors), power bipolar transistors or power diodes. By way of example, the source electrode and gate electrode of a power MOSFET may be situated on one main face, while the drain electrode of the power MOSFET is arranged on the other main face.

The basic principle presented here will be elucidated on the basis of the examples given below.

In accordance with various embodiments, one or more semiconductor devices on a substrate wafer, each having a self-aligned back-side conductive layer is provided.

In accordance with various embodiments, a planarized back-side conductive layer is provided.

In accordance with various embodiments, a substrate wafer may be singulated without involving a second lithographic process.

In accordance with various embodiments, a back-side conductive layer may be provided that is self-aligned with a front-side conductive layer minimizing cost and complexity.

In accordance with various embodiments, a back-side metallization process is provided which allows dicing before thinning.

In accordance with various embodiments, a back-side conductive layer may be separated by a thinning process without involving a wet-chemical metal etching process.

In accordance with various embodiments, the chip edge may be completely covered by a polymer structure.

In accordance with various embodiments, the back-side surface of a substrate wafer is completely covered by an electrically conductive layer.

In accordance with various embodiments, a buried etch stop layer may be formed when a low total thickness variation is required.

Figure 1B:
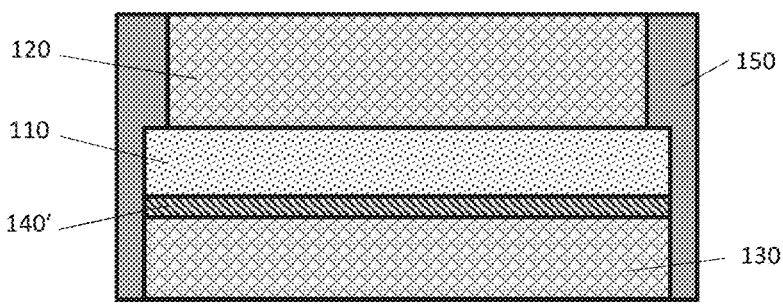
Figure 1C:
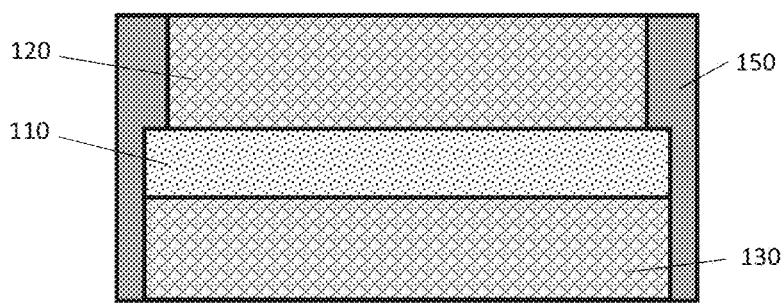

FIGS. 1A-1C are cross-sectional views of semiconductor devices having a self-aligned back-side conductive layer and a chip-edge encapsulation structure according to various embodiments. FIG. 2F is a cross-sectional view of a substrate wafer arrangement in a final stage of forming one or more of such semiconductor devices.

Referring to FIG. 1A, the semiconductor device 101 may, for example, be a semiconductor chip or a part thereof. Referring to FIG. 2F, the semiconductor device 101 may be one of a plurality of semiconductor devices formed in or over a substrate wafer 105. The substrate wafer 105 has a first main face and a second main face opposite the first main face. The first main face is a front (or top) side and the second main face is a back (or bottom) side. The substrate wafer may include one or more electronic devices on the first main face.

The substrate wafer may include a semiconductor material and/or other different material. For example, the substrate wafer 105 may be manufactured from any semiconductor material. For example, it may be made from silicon (Si), silicon carbide (SiC), silicon germanium (SiGe), gallium nitride (GaN), or gallium arsenide (GaAs). Furthermore, it may contain inorganic and/or organic materials that are not semiconductors, such as for example insulators, plastics or metals. For example, the top layer including the first main face may be sapphire with GaN or SiC. The substrate wafer 105 may also be a graphite wafer including a silicon top layer.

As shown in FIG. 2F, the semiconductor device 101 shown in FIG. 1A may be a singulated chip die of the plurality of chip dies of the substrate wafer 105. Referring to FIG. 1A, each of the semiconductor devices 101 may include a substrate layer 110, a front-side conductive layer 120, a back-side conductive layer 130, a barrier layer 140, and a chip edge encapsulation structure 150. The substrate layer 110 may include one or more electrical components formed in or over the front-side surface of the substrate layer 110. The substrate layer 110, the front-side conductive layer 120, and the back-side conductive layer 130 are disposed in a vertical stack such that the substrate layer 110 is disposed between the two conductive layers. The front-side conductive layer 120 is disposed over the substrate layer 110 which is disposed over the back-side conductive layer 130 so that they are all aligned with each other in the vertical direction. The barrier layer 140 is generally disposed between the substrate layer 110 and the back-side conductive layer 130. The chip edge encapsulation structure 150 surrounds the outer edge of the chip die covering the lateral edges or side surfaces of each of the substrate layer 110, the front-side conductive layer 120, and the barrier layer 140 and/or the back-side conductive layer 130.

Referring to FIGS. 1A-1B, the barrier layer 140 may include a top wall disposed between the bottom (hack) surface of the substrate layer 110 and the top (front) surface of the back-side conductive layer 130. Further, as shown in FIG. 1A, the barrier layer 140 may also include sidewalls disposed between the side surfaces or lateral edges of the back-side conductive layer 130 and the chip edge encapsulation structure 150 so that only a bottom surface of the hack-side conductive layer 130 is exposed.

Figure 4:
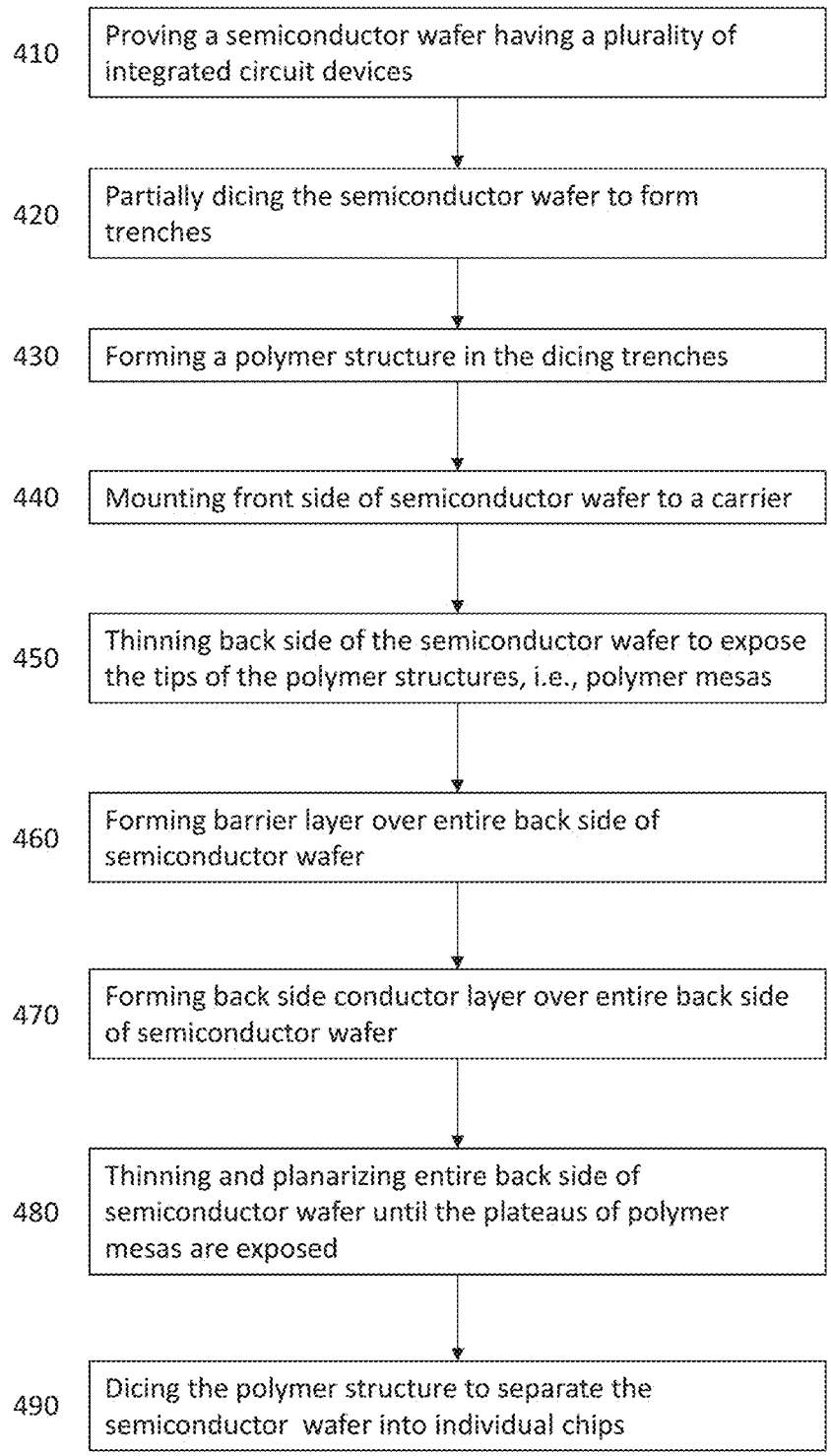
FIG. 4 shows a flow chart of a process for manufacturing a plurality of semiconductor devices having a self-aligned back-side conductive layer and a chip-edge encapsulation structure according to various embodiments.
Figure 5:
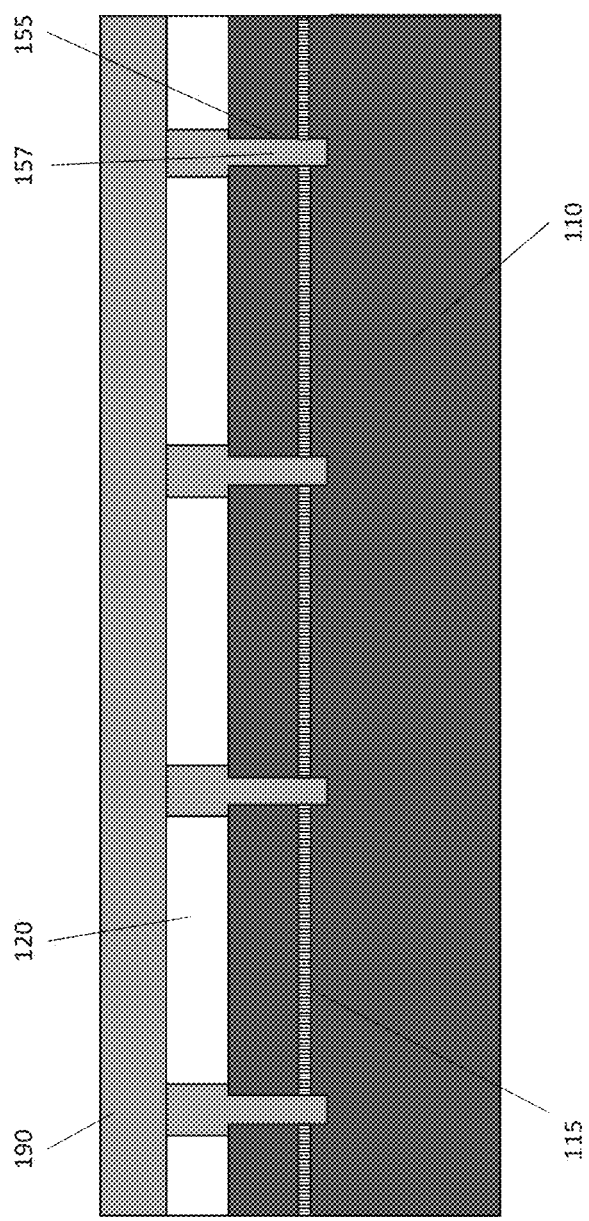
FIG. 5 is cross-sectional view of a substrate wafer arrangement in a stage of forming a semiconductor device having a self-aligned back-side conductive layer and a chip-edge encapsulation structure according to various embodiments.

Many processes may be used to produce a semiconductor device 101 having a self-aligned back-side conductive layer 130 and a protective chip edge encapsulation structure 150. One possible process flow is shown in FIG. 4 of a process 400 for manufacturing a plurality of semiconductor devices having a self-aligned back-side conductive layer and a chip-edge encapsulation structure according to various embodiments.

The process may involve a combination of suitable and well-known semiconductor manufacturing techniques. The process flow is described with respect to a plurality of chip dies formed in or on a substrate wafer 105. The process flow may be applied to an entire substrate wafer by extending the patterning to a suitable and appropriate patterning for the substrate wafer.

FIGS. 2A-2F are cross-sectional views of a substrate wafer arrangement in various stages of forming one or more of the semiconductor devices having a self-aligned back-side conductive layer and a chip-edge encapsulation structure according to various embodiments.

Figure 3:
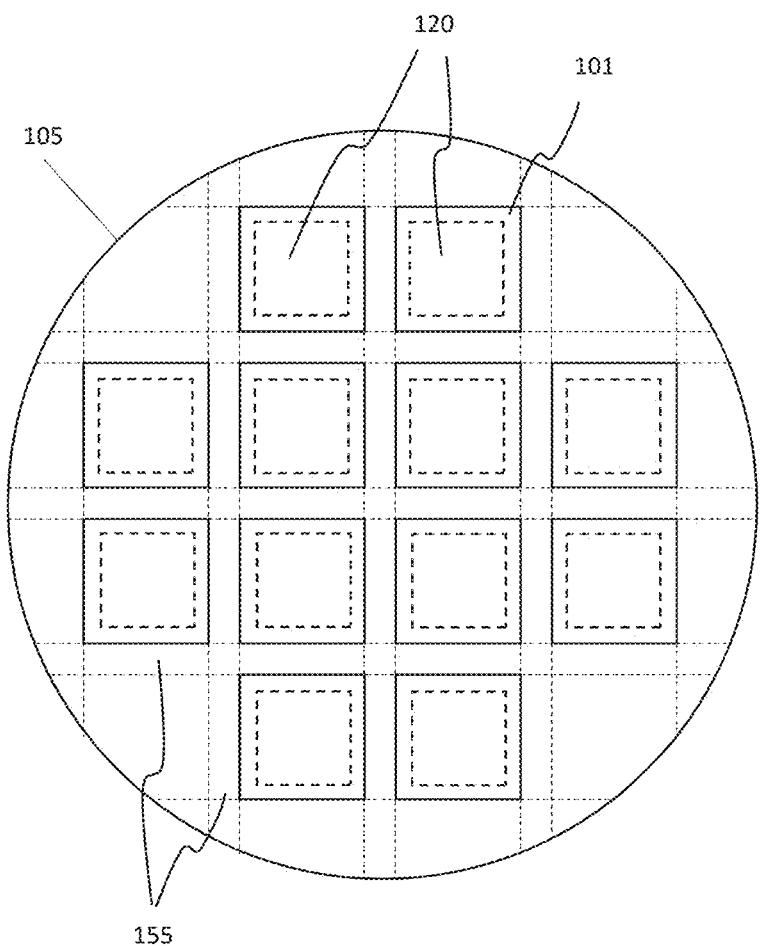
FIG. 3 shows a top view of a substrate wafer including a plurality of semiconductor devices according to various embodiments.

FIG. 3 shows a top view of a substrate wafer including a plurality of semiconductor devices according to various embodiments.

Figure 2A:
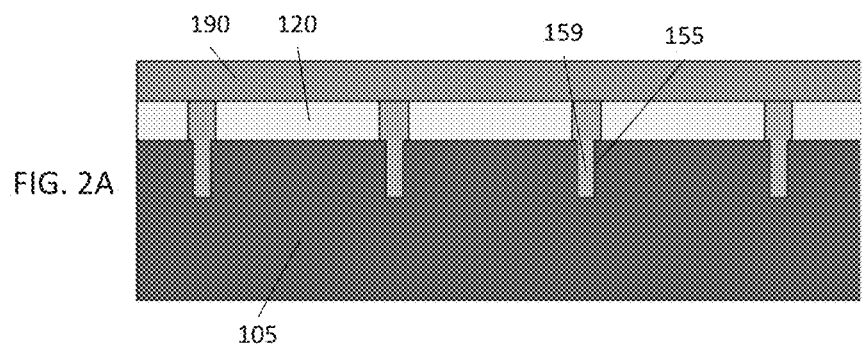
FIGS. 2A, 2B, 2C, 2D, 2E, 2F, and 2B' are cross-sectional views of a substrate wafer arrangement in various stages of forming a semiconductor device having a self-aligned back-side conductive layer and a chip-edge encapsulation structure according to various embodiments.

At 410, referring to FIG. 2A, a plurality of semiconductor devices 101 may be formed on a substrate wafer 105. The substrate wafer may have a diameter in the range from about 200 mm to about 300 mm and a thickness in the range from about 500 μm to about 1000 μm. Active and passive electrical components of each semiconductor device 101 may be formed using any suitable and well-known semiconductor manufacturing technique in or over the front-side surface of the substrate wafer 105. For example, the electrical components may be implemented by standard work flow. The electrical components may be patterned to form circuit structures. Standard work flow may include forming an epitaxial layer to prepare the front-side surface of the substrate wafer 105 and using lithography techniques to pattern electrical components or circuit structures in the chip die area corresponding to each semiconductor device 101.

Referring to FIG. 2A, a front-side conductive layer 120 may be formed over each of the plurality of semiconductor devices 101. The front-side conductive layer 120 may be formed using any suitable and well-known semiconductor manufacturing technique over the front-side surface of the substrate wafer 105. For example, standard lithography techniques or screen printing may be used to form a patterned front-side conductive layer 120, as shown in FIG. 2A, having respective islands of conductive material corresponding to each semiconductor device 101 on the front-side surface of the substrate wafer 105. The front-side conductive layer 120 may, for example, be made of copper, tin, gold, silver, or alloys thereof. The front-side conductive layer 120 may have a thickness in the range from about 10 μm to about 30 μm. It is usually used for voltage termination in chip edge structures.

At 420, the substrate wafer 105 is subject to a partial dicing process to divide the substrate wafer 105 into individual chips. The partial dicing process may include forming grooves or trenches 155 in the substrate wafer 105 along scribe or dicing lines in between the patterned islands of metal in the front-side conductive layer 120 that correspond to the edges of a chip die. For example, the scribe or dicing lines may form a rectangular grid, a hexagonal grid, or any other pattern. For example, referring to FIG. 3, the scribe or dicing lines may form a rectangular grid.

Any suitable and well-known technique for dicing may be applied, including for example, blade dicing (sawing), laser dicing, plasma dicing, etc. For example, a diamond saw based half-cut dicer, laser based stealth dicer, or an ion based dry etching dicer may be used.

The depth of the grooves or trenches 155 formed in the substrate wafer 105 should be at least as deep as the combined thickness of the target thickness of the substrate layer 110 and the target thickness of the back-side conductive layer 130. For example, the depths of the grooves or trenches 155 may be in the range from about 20 μm to about 50 μm. The width of the grooves or trenches may depend on the dicing technique. The width should be wide enough to ensure electrical insulation between the patterned islands of conductive material of the front-side conductive layer 120 and between the self-aligned islands of conductive material of the back-side conductive layer 130. For example, the width of the grooves or trenches 155 formed in the substrate wafer 105 may be in the range from about 10 μm to about 100 μm.

At 430, following the partial dicing, the grooves or trenches 155 are filled with a polymer fill material 157 to form a polymer structure 159. The polymer fill material 157 is deposited until it completely fills the grooves or trenches 155. When a front-side conductive layer 120 is present, the space between the patterned islands of conductive material of the front-side conductive layer 120 above the grooves or trenches 155 may also be completely filled. The polymer fill material 157 should be a material that is resistant to semiconductor etchants and may be thinnable or grindable together with a conductive layer, such as the back-side conductor layer 130. The polymer fill material 157 may include, for example, epoxy, imide, photoimide, photoresist, duroplasts, elastomers, thermosetting material, or thermoplastic material. The polymer fill material 157 may be applied by any suitable and well-known manufacturing technique including, for example, lithography, spin coating, printing, or dispensing. The polymer fill material 157 may provide stress relief during the thinning or grinding process. The polymer fill material 157 when set or cured should be strong enough to withstand the compression stress and shear stress during the thinning or grinding process.

At 440, the front-side of the substrate wafer arrangement including for example the front-side conductive layer 120 and the polymer structure 159 may be mounted with adhesives on a carrier 190 that provides mechanical support while the back-side of the substrate wafer 105 is processed. The carrier may for example be a glass substrate. The adhesive or bonding material may be applied to electrically and mechanically connect the semiconductor chip, e.g., to a carrier or, e.g., to a contact clip. The adhesive or bonding material may be applied to the entire front-side topography of the substrate wafer arrangement. The adhesive or bonding material may be any well-known and suitable material. For example, a soft solder material or, in particular, a solder material capable of forming diffusion solder bonds may be used, for example solder material including one or more of tin (Sn), tin-silver (SnAg), tin-gold (SnAu), tin-copper (SnCu), indium (In), indium-silver (InAg), indium-cooper (InCu), and indium-gold (InAu). The bonding should be strong enough to prevent infiltration of any grinding fluid during polishing and prevent generation of cracks.

Figure 2B:
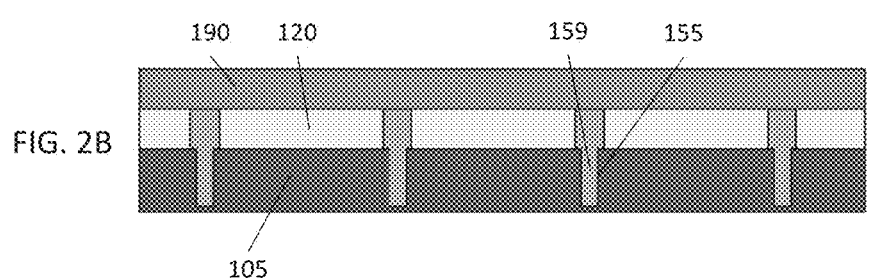

At 450, once the substrate wafer 105 is mounted the entire back-side of the substrate wafer 105 may be subject to a first thinning process. The thinning process may include one or more stages, where each stage may involve a grinding process, a CMP process, an etching process, or any process which mechanically or chemically removes material from the back-side of the substrate wafer arrangement. For example, the thinning process may be a two-stage thinning process. Referring to FIG. 2B, a first stage may include a mechanical grinding process that grinds the hack-side of the substrate wafer 105 until the thickness of the substrate wafer 105 is within a range of reaching the target thickness of the substrate layer 110 of the chip die. For example, the range may be from about 5 μm to 20 μm. Alternatively, referring to FIG. 2B', the first stage may include a mechanical grinding process that grinds the back-side of the substrate wafer 105 until the polymer fill material is reached. The substrate wafer may also be thinned in the first stage by chemical mechanical polishing (CMP).

Figure 2C:
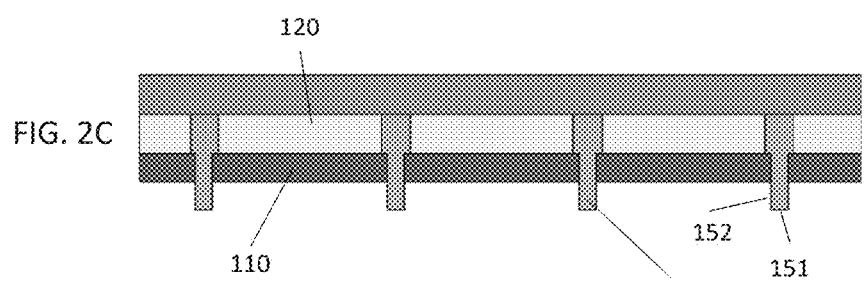

In the second stage, additional substrate material may be removed by etching using either a wet or dry etching technique. For example, the last 5 µm to 20 µm of substrate material may be removed by etching using either a wet or dry etching technique. The second stage thinning process reveals portions of the polymer structure 159 that were formed at the bottom of the grooves or trenches 155. Referring to FIG. 2C, the substrate material has been etched to expose portions of the polymer structure 159. The exposed portions of the polymer structure 159 may be referred to as polymer mesas 153 have plateaus 151 and sidewalk 152.

Alternatively, the thinning process may be a single stage thinning process. For example, the first stage may be completely replaced by the second stage. That is, the thinning process may eschew a grinding process and only involve an etching process to remove substrate material to expose portions of the polymer structure 159.

After thinning, the substrate wafer 105 should be at the target thickness of the substrate layer 110 of the chip die. For example, the substrate wafer 105 may have a target thickness less than 100 µm. For example, it may have a target thickness in the range from about 2 µm to about 60 µm.

Figure 2D:
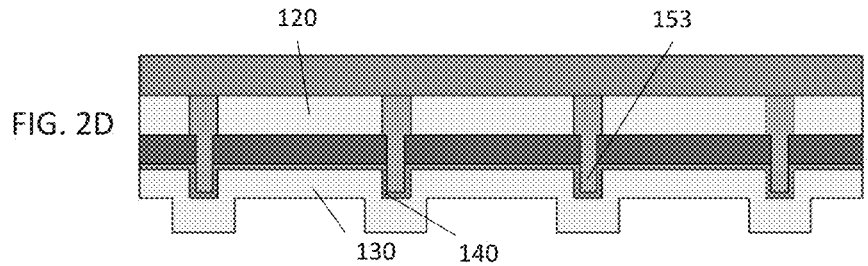
Figure 2E:
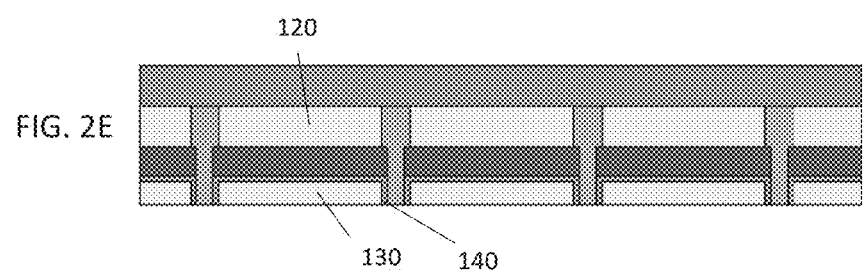
Figure 2F:
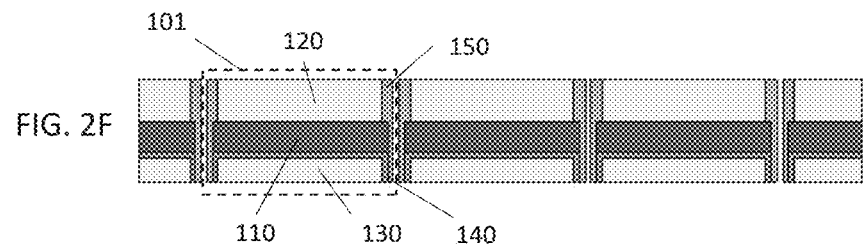
Figure 2B:
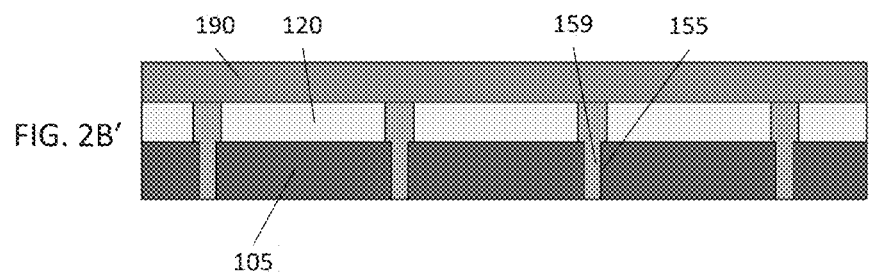

At 460, a barrier layer 140 may be formed on the entire back-side surface of the substrate wafer 105. As shown in FIG. 2D, the barrier layer 140 may be applied to any exposed surfaces on the back-side of the substrate wafer 105. The barrier layer 140 may be applied by any suitable and well-known manufacturing technique including, for example, sputtering. The barrier layer 140 should cover all the exposed back-side surfaces of the substrate layer 110. The barrier layer 140 may also cover the plateaus 151 and sidewalls 152 of the polymer mesas 153. While FIG. 2D shows polymer mesas 153 having vertical sidewalk 152, the sidewalls 152 may be sloped where the width of the polymer mesas 153 at the base at the back-side surface of the wafer is wider than the width of the plateaus 151 of the polymer mesas 153.

The barrier layer prevents diffusion of metal ions from the metallization layer into the semiconductor material. For example, the barrier layer may be used to prevent the formation of copper-silicide. Barrier layers may be formed for example tungsten (W), tungsten nitride (WN), or titanium nitride (TiN).

Depending on the metallization process, the harrier layer 140 may be covered by a thin conductive film ("seed layer") which facilitates a subsequent copper-plating process. The seed layer may be connected with the corresponding front-side conductive layer 120 to realize a continuous, electrical contact to an external power source. For example, a barrier/copper seed layer may be in the range from about 100 nm to about 300 nm thick. The aspect ratios of the sidewalls 152 of the polymer mesas should be suitable for sputtering both the diffusion barrier layer and seed layer.

At 470, a back-side conductive layer 130 is applied to the entire back-side surface of the substrate wafer 105. The back-side conductive layer 130 should be applied to completely cover the back-side surface of the substrate layer 110 and the barrier layer 140 if present. The back-side conductive layer 130 should also completely cover the plateaus 151 and sidewalk 152 of the polymer mesas 153. The applied thickness of the back-side conductive layer 130 should be greater than the target thickness of the back-side conductive layer 130. It may be greater than the height of the polymer mesas 153. For example, the target thickness of the back-side conductive layer 130 may be in the range from about 5 µm to about 40 µm and the applied thickness of the back-side conductive layer 130 may be about 2 µm to about 10 µm more than the target thickness of the back-side conductive layer 130. The applied thickness may depend on the tolerances of the processing equipment.

The back-side conductive layer 130 may be formed using any suitable and well-known semiconductor manufacturing technique over the front-side surface of the substrate wafer 105. Such techniques include those in which layers are applied at once as a whole like, for example, laminating techniques as well as techniques in which layers are deposited in a sequential manner like, for example, spraying, sputtering, plating, molding, CVD (Chemical Vapor Deposition), PVD (physical vapor deposition), evaporation, hybrid physical-chemical vapor deposition (HPCVD), etc.

The applied conductive layer may include, inter alia, one or more of a layer of metal such as copper (Cu) or tin (Sn) or an alloy thereof or a layer of a conductive paste. The layer of a metal may be a homogeneous layer. The conductive paste may contain metal particles distributed in a vaporizable or curable polymer material, wherein the paste may be fluid, viscous or waxy.

In various embodiments, the back-side conductive layer 130 may be made from a low stress metal such as for example porous copper to provide mechanical stability. In various embodiments, the back-side conductive layer 130 may also function as a heatsink for the semiconductor device 101, In various embodiments, the back-side conductive layer 130 may also function as an electrical contact for the semiconductor device 101.

At 480, the back-side of the substrate wafer arrangement including for example the back-side conductor layer 130, barrier layer 140, and/or the polymer structure 159 may be subject to a second thinning process. The back-side of the substrate wafer arrangement is thinned until the surfaces of the plateaus 151 of the polymer mesas 153 are exposed. In various embodiments, a small portion of the polymer mesas 153 near the plateaus may also be thinned to ensure that the back-side of the substrate wafer arrangement is flat, i.e., planarized. Following the thinning process, the back-side conductor layer 130 becomes separated forming self-aligned insular islands of conductive material corresponding to each of the plurality of semiconductor devices 101 of a substrate wafer 105. The polymer mesas 153 provide insulating buffers between the islands of conductive material of the back-side conductive layer 130. Each island of conductive material of the back-side conductive layer 140 may also be self-aligned with a corresponding patterned island of conductive material of the front-side conductive layer 120. The thinning process may include one or more stages, where each stage may involve a grinding process, a CMP process, an etching process, or any process which mechanically or chemically removes material from the back-side of the substrate wafer arrangement. The thinning process may also planarize the back-side of the substrate wafer arrangement.

At 490, in preparation for chip separation, the substrate wafer 105 may be demounted onto frame and the adhesive bonding material may be removed from the front-side. The substrate wafer 105 may be separated into individual chips using a laser beam of a wavelength capable of transmitting through the polymer structure 159. The substrate wafer 105 may be diced by moving the relative positions of the laser beam and the substrate wafer in order to scan the substrate wafer according to the desired dicing pattern. Any other well-known and suitable dicing techniques may also be used.

In various embodiments, a semiconductor device 101 having a low total thickness variation of the substrate layer 110 may be formed. For example, prior to forming electrical components in or over the front-side surface of the substrate wafer 105 at 410, a buried etch stop layer 115 may be formed in the substrate material below the front-side surface of the substrate wafer 105. The buried etch stop layer 115 may be used to control the etching depth during the second stage at 450. The buried etch stop layer 115 should be formed at a depth at about the target thickness of the substrate layer 110 of the chip die. During the second stage of the thinning process at 450, the substrate material between the back-side surface of the substrate wafer arrangement and the buried etch stop layer 115 may be etched away to reduce the thickness of the substrate layer 110 and reveal the polymer mesas 153. At the end of the second stage, when etching of the substrate material is completed, the buried etch stop layer 115, if used, may be removed by a different etchant. Thus, a substrate layer 110 having a more uniform thickness may be provided.

The buried etch stop layer 115 may be formed using any suitable and well-known semiconductor manufacturing techniques. For example, the buried etch stop layer may be implemented as a highly doped layer (e.g., boron doped p+ layer). As another example, the buried etch stop layer may be a buried oxide layer formed by an Epitaxial Lateral Overgrowth (ELO) process in which oxide islands are buried under an epitaxial layer or it may be a buried oxide layer formed by a Separation by IMplantation of OXygen (SIMOX) process which uses an oxygen ion beam implantation process followed by high temperature annealing to create a buried $SiO_2$ layer.

In the following, various aspects of this disclosure will be illustrated:

Example 1 is a method for manufacturing a semiconductor device including: partially dicing a substrate wafer arrangement having a front-side and a back-side that is opposite the front-side, the substrate wafer arrangement further including a plurality of semiconductor chips, wherein the partial dicing forms trenches having a depth around the plurality of semiconductor chips on the front-side of the substrate wafer arrangement, the depth being greater than a target thickness of the plurality of semiconductor chips; filling the trenches with a polymer material so as to form a polymer structure; first thinning the back-side of the substrate wafer arrangement so as to expose portions of the polymer structure; forming a conductive layer on the back-side of the substrate wafer arrangement so that the exposed portions of the polymer structure are covered; second thinning the back-side of the substrate wafer arrangement so as to form insular islands of conductive material from the conductive layer, the insular islands separated from each other by the polymer structure, each insular island corresponding to a respective one of the plurality of semiconductor chips; and dicing the substrate wafer along the polymer structure to form individual semiconductor chips.

In Example 2, the subject matter of Example 1 can optionally include that the exposed portions of the polymer structure have a height, wherein the height is at least the target thickness of the conductive layer.

In Example 3, the subject matter of Example 2 can optionally include that the depth is at least the total of the target thickness of a substrate layer of the substrate wafer arrangement and the height.

In Example 4, the subject matter of any of Examples 2 or 3 can optionally include that the height is in the range from about 5 µm to about 40 µm.

In Example 5, the subject matter of any of Examples 1-4 can optionally include providing a patterned conductive layer on the front-side of the substrate wafer arrangement so as to form patterned islands of conductive material, each patterned island corresponding to a respective one of the plurality of semiconductor chips.

In Example 6, the subject matter of any of Examples 1-5 can optionally include providing a barrier layer wherein a portion of the barrier layer corresponding to a respective one of the plurality of semiconductor chips includes a top wall and a sidewall that covers a corresponding insular island.

In Example 6a, the subject matter of any of Examples 1-6 can optionally include forming electrical components in or over the front-side of the substrate wafer arrangement.

In Example 6b, the subject matter of any of Examples 1-6a can optionally include that the first thinning includes an etching process.

In Example 6c, the subject matter of any of Examples 1-6b can optionally include that the first thinning includes two stages, wherein a first stage includes grinding the back-side of the substrate wafer arrangement and a second stage includes etching the back-side of the substrate wafer arrangement so as to expose portions of the polymer structure.

In Example 6d, the subject matter of Examples 6c can optionally include that the first stage includes grinding the back-side of the substrate wafer arrangement without exposing the polymer structure.

In Example 6e, the subject matter of any of Examples 1-6d can optionally include providing a buried etch stop layer disposed under a front-side surface of the substrate wafer arrangement and etching the back-side of the substrate wafer arrangement thereby thinning the substrate wafer arrangement, wherein the etching is complete when an etchant contacts the buried etch stop layer.

In Example 6f, the subject matter of Example 6e can optionally include that the distance between the buried etch stop layer and the front-side surface of the substrate wafer arrangement is about a target thickness of the plurality of semiconductor chips.

Example 7 is a substrate wafer arrangement including: a substrate layer having a first main side and a second main side opposite the first main side, the first main side is a front-side and the second main side is a back-side, the substrate layer further including a plurality of semiconductor chips; a polymer structure arranged between the plurality of semiconductor chips, the polymer structure extends at least from the front-side of the substrate layer to the back-side of the substrate layer and protrudes from a back-side surface of the substrate layer; and a plurality of insular islands of conductive material separated by the polymer structure, each insular island corresponding to a respective semiconductor chip of the plurality of semiconductor chips.

In Example 8, the subject matter of Example 7 can optionally include that each insular island of conductive material includes a continuous layer of metal having a back-side surface that is on the same plane as a back-side surface of the polymer structure.

In Example 9, the subject matter of any of Examples 7 or 8 can optionally include that a height of the polymer structure protruding from the back-side surface of the substrate layer is in the range from about 5 µm to about 40 µm.

In Example 10, the subject matter of any of Examples 7-9 can optionally include a patterned conductive layer on the front-side of the substrate layer including patterned islands of conductive material, each patterned island corresponding to a respective one of the plurality of semiconductor chips.

In Example 11, the subject matter a of Examples 7-10 can optionally include a barrier layer wherein a portion of the barrier layer corresponding to a respective one of the plurality of semiconductor chips includes a top wall and a sidewall that covers a corresponding insular island.

In Example 11a, the subject matter of any of Examples 7-10 can optionally include a buried etch stop layer disposed under a front-side surface of the substrate wafer arrangement.

In Example 11b, the subject matter of Example 11a can optionally include that the distance between the buried etch stop layer and the front-side surface of the substrate wafer arrangement is about a target thickness of the plurality of semiconductor chips.

Example 12 is a semiconductor device including: a substrate layer having a first main side and a second main side opposite the first main side, the first main side is a front-side and the second main side is a back-side; one or more electrical components formed in or over the front-side of the substrate layer; a back-side conductive layer disposed on the back-side of the substrate layer; and a polymer structure that extends vertically at least from the front-side of the substrate layer to the back-side of the back-side conductive layer and surrounds the edges of the substrate layer and the edges of the back-side conductive layer.

In Example 13, the subject matter of Example 12 can optionally include a front-side conductive layer disposed on the front-side of the substrate layer so that it is aligned with the substrate layer and the back-side conductive layer.

In Example 14, the subject matter of Example 12 or 13 can optionally include a barrier layer disposed between the substrate layer and the back-side conductive layer, the barrier layer including a top wall and a sidewall, the wherein the top wall is disposed between the back surface of the substrate layer and the front surface of the back-side conductive layer and the sidewall is disposed between the edges of the back-side conductive layer and the polymer structure.

In Example 15, the subject matter of any of Examples 12-14 can optionally include that the polymer structure is a chip edge encapsulation structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A substrate wafer arrangement, comprising:
   a substrate layer comprising a first main side and a second main side opposite the first main side, the first main side being a front-side and the second main side being a back-side, the substrate layer further comprising a plurality of semiconductor chips;
   a polymer structure arranged between the plurality of semiconductor chips, the polymer structure extending at least from the front-side of the substrate layer to the back-side of the substrate layer and protruding from a back-side surface of the substrate layer; and
   a plurality of insular islands of conductive material separated by the polymer structure, each insular island corresponding to a respective semiconductor chip of the plurality of semiconductor chips.

2. The substrate wafer arrangement of claim 1, wherein each insular island of conductive material comprises a continuous layer of metal having a back-side surface that is on a same plane as a back-side surface of the polymer structure.

3. The substrate wafer arrangement of claim 1, wherein a height of the polymer structure protruding from the back-side surface of the substrate layer is in a range from about 5 μm to about 40 μm.

4. The substrate wafer arrangement of claim 1, further comprising:
   a patterned conductive layer on the front-side of the substrate layer comprising patterned islands of conductive material, each patterned island corresponding to a respective one of the plurality of semiconductor chips.

5. The substrate wafer arrangement of claim 1, further comprising:
   a barrier layer,
   wherein a portion of the barrier layer corresponding to a respective one of the plurality of semiconductor chips comprises a top wall and/or a sidewall that covers a corresponding insular island.

6. The substrate wafer arrangement of claim 5, wherein the barrier layer prevents diffusion of metal ions from the insular islands of conductive material into the substrate layer.

7. The substrate wafer arrangement of claim 5, wherein the barrier layer prevents formation of copper-silicide on the substrate layer.

8. The substrate wafer arrangement of claim 5, wherein the barrier layer comprises tungsten (W), tungsten nitride (WN), or titanium nitride (TiN).

9. The substrate wafer arrangement of claim 5, further comprising a thin conductive film covering the barrier layer.

10. The substrate wafer arrangement of claim 1, further comprising:
    a patterned conductive layer on the front-side of the substrate layer comprising patterned islands of conductive material, each patterned island corresponding to a respective one of the plurality of semiconductor chips; and
    a barrier layer wherein a portion of the barrier layer corresponding to a respective one of the plurality of semiconductor chips comprises a top wall and/or a sidewall that covers a corresponding insular island.

11. The substrate wafer arrangement of claim 10, wherein the polymer structure is wider between adjacent ones of the patterned islands and narrower between adjacent ones of the semiconductor chips.

12. The substrate wafer arrangement of claim 1, wherein a gap between adjacent ones of the semiconductor chips is occupied only by the polymer structure.

13. A semiconductor device, comprising:
    a substrate layer having a first main side and a second main side opposite the first main side, the first main side being a front-side and the second main side being a back-side;
    one or more electrical components formed in or over the front-side of the substrate layer;
    a back-side conductive layer disposed on the back-side of the substrate layer; and
    a polymer structure extending vertically at least from the front-side of the substrate layer to a back-side of the back-side conductive layer and surrounding edges of the substrate layer and edges of the back-side conductive layer.

14. The semiconductor device of claim 13, further comprising:

a front-side conductive layer disposed on the front-side of the substrate layer so that the front-side conductive layer is aligned with the substrate layer and the back-side conductive layer.

15. The semiconductor device of claim 14, wherein the polymer structure is wider along edges of the front-side conductive layer and narrower along the edges of the substrate layer.

16. The semiconductor device of claim 13, further comprising:
a barrier layer disposed between the substrate layer and the back-side conductive layer, the barrier layer comprising a top wall and a sidewall, wherein the top wall is disposed between the back-side of the substrate layer and a front-side of the back-side conductive layer, and wherein the sidewall is disposed between the edges of the back-side conductive layer and the polymer structure.

17. The semiconductor device of claim 16, wherein the barrier layer prevents diffusion of metal ions from the back-side conductive layer into the substrate layer and prevents formation of copper-silicide on the substrate layer.

18. The semiconductor device of claim 16, wherein the barrier layer comprises tungsten (W), tungsten nitride (WN), or titanium nitride (TiN).

19. The semiconductor device of claim 16, further comprising a thin conductive film covering the barrier layer.

20. The semiconductor device of claim 13, further comprising:
a front-side conductive layer disposed on the front-side of the substrate layer so that the front-side conductive layer is aligned with the substrate layer and the back-side conductive layer; and
a barrier layer disposed between the substrate layer and the back-side conductive layer, the barrier layer comprising a top wall and a sidewall,
wherein the top wall is disposed between the back-side of the substrate layer and a front-side of the back-side conductive layer,
wherein the sidewall is disposed between the edges of the back-side conductive layer and the polymer structure.

21. The semiconductor device of claim 13, wherein the polymer structure is a chip edge encapsulation structure.

22. The substrate wafer arrangement of claim 12, wherein only the polymer structure surrounds the edges of the substrate layer.

* * * * *